(12) United States Patent
Hao

(10) Patent No.: US 10,755,653 B2
(45) Date of Patent: Aug. 25, 2020

(54) VERTICAL ALIGNMENT LIQUID CRYSTAL DISPLAY

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Sikun Hao, Guangdong (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/112,502

(22) Filed: Aug. 24, 2018

(65) Prior Publication Data
US 2019/0304385 A1 Oct. 3, 2019

Related U.S. Application Data

(63) Continuation of application No. PCT/CN2018/092354, filed on Jun. 22, 2018.

(30) Foreign Application Priority Data

Apr. 2, 2018 (CN) .......................... 2018 1 0284062

(51) Int. Cl.
*G09G 3/36* (2006.01)
*H01L 27/12* (2006.01)
*G02F 1/1343* (2006.01)

(52) U.S. Cl.
CPC ..... *G09G 3/3607* (2013.01); *G02F 1/134336* (2013.01); *G09G 3/3648* (2013.01);
(Continued)

(58) Field of Classification Search
CPC ..... G09G 2300/0447; G09G 2320/028; G09G 2320/066; G09G 2320/068
See application file for complete search history.

(56) References Cited

U.S. PATENT DOCUMENTS 6,166,725 A * 12/2000 Isami .................... G09G 3/3688
345/209
2010/0295843 A1* 11/2010 Liu ....................... G09G 3/3614
345/214
(Continued)

*Primary Examiner* — Dong Hui Liang
(74) *Attorney, Agent, or Firm* — Leong C. Lei

(57) ABSTRACT

Provided is a vertical alignment liquid crystal display, comprising a plurality of data lines, a plurality of scan lines and a plurality of common electrode lines; the scan lines intersect the data lines and the common electrode lines to form a plurality of pixel regions arranged in an array; the sub pixel region comprises a first thin film transistor, a second thin film transistor and a sub pixel, and gates of the first thin film transistor and second thin film transistor are coupled to a same scan line, and drains of the first thin film transistor and second thin film transistor are respectively coupled to a data line and a common electrode line which are adjacent, and sources of the first thin film transistor and second thin film transistor are coupled to the sub pixel; the main pixel region comprises a third thin film transistor and a sub pixel.

12 Claims, 6 Drawing Sheets

(52) U.S. Cl.
CPC ............... *H01L 27/124* (2013.01); *G02F 2001/134345* (2013.01); *G09G 2300/0447* (2013.01); *G09G 2300/0804* (2013.01); *G09G 2300/0809* (2013.01); *G09G 2310/06* (2013.01); *G09G 2320/028* (2013.01); *G09G 2320/0209* (2013.01); *G09G 2320/0233* (2013.01); *G09G 2320/0242* (2013.01); *G09G 2320/066* (2013.01)

(56) References Cited

U.S. PATENT DOCUMENTS

| | | | |
|---|---|---|---|
| 2014/0104523 A1* | 4/2014 | Jung | G02F 1/1343 349/41 |
| 2015/0248864 A1* | 9/2015 | Chen | G09G 3/3607 345/92 |
| 2016/0049124 A1* | 2/2016 | Tsuei | G09G 3/3607 345/589 |
| 2016/0275890 A1* | 9/2016 | Ra | G02F 1/136259 |
| 2018/0315386 A1* | 11/2018 | Gan | G09G 3/3648 |

* cited by examiner

VERTICAL ALIGNMENT LIQUID CRYSTAL DISPLAY

CROSS-REFERENCE TO RELATED APPLICATION

This application is a continuing application of PCT Patent Application No. PCT/CN2018/092354 entitled "Vertical alignment liquid crystal display", filed on Jun. 22, 2018, which claims priority to Chinese Patent Application No. 201810284062.8, filed on Apr. 2, 2018, both of which are hereby incorporated in its entireties by reference.

FIELD OF THE INVENTION

The present invention relates to a display field, and more particularly to a vertical alignment liquid crystal display.

BACKGROUND OF THE INVENTION

Liquid crystal display is one of the most widely used flat panel displays, and has gradually become widely used in various electronic devices, such as mobile phones, personal digital assistants (PDAs), digital cameras, computer screens or laptop screens, thus has a display with a high resolution color screen. The current liquid crystal displays usually have an upper substrate, a lower substrate and an intermediate liquid crystal layer, and the substrate is composed of glass and electrodes. In case that both the upper substrate and lower substrate have electrodes, a vertical electric field mode display, such as a TN (Twist Nematic) mode, a VA (Vertical Alignment) mode can be developed and an MVA (Multi-domain Vertical Alignment mode) to solve the narrow viewing angle can be developed. In another type, unlike the above display, the electrodes are located only on one side of the substrate to form a display of a transverse electric field mode, such as an IPS (In-plane switching) mode and an FFS (Fringe Field Switching) mode. Compared with cathode ray tube displays, the Thin Film Transistor Liquid Crystal Display (TFT-LCD) has a relatively narrow viewing angle, which brings great limitations for the application in high-end display fields, where the viewing angle is critical, such as aerospace, medical and other fields. With the rapid development of wide viewing angle technology in the LCD field, the viewing angles of many products have been able to achieve horizontal viewing angles and vertical viewing angles of 85 degrees/85 degrees, and even to achieve larger viewing angles.

LCD wide viewing angle technology currently mainly includes Multi-domain Vertical Alignment technology and In Plane Switching (IPS) technology. The advantage of the vertical alignment mode is that the front contrast is high, usually up to 4000:1 and above; the IPS technology rotates the liquid crystal molecules under action of the horizontal electric field by forming pixel electrodes and common electrodes which are parallel and repeatedly distributed on the TFT (thin film transistor) array substrate to form a wide viewing angle. However, the contrast is relatively low, generally below 2000:1.

FIG. 1 shows a common driving circuit of a liquid crystal display according to the prior art. In such driving circuit, the number of scan lines is twice of the horizontal resolution, and each row of sub pixels requires two scan lines to be driven; the number of data lines is ½ of the vertical resolution and each data line drives two columns of sub pixels at left and right.

FIG. 2 shows gamma curves of a vertical alignment liquid crystal display provided by the present invention at different viewing angles. The bottom curve is the gamma curve corresponding to the 0 degree view angle, and the top curve is the gamma curve corresponding to the 70 degrees view angle. The gamma curves corresponding to the 10 degrees view angle, the 20 degrees view angle, the 30 degrees view angle, the 40 degrees view angle, the 50 degrees view angle, and the 60 degrees view angle are sequentially arranged from bottom to top between the foregoing two gamma curves. It can be seen that the transmittances of the liquid crystal display corresponding to the 10 degrees view angle to the 70 degrees view angle are greater than the transmittance corresponding to the 0 degree view angle under the same gray level, resulting in that the color deviations of the liquid crystal display corresponding to the 10 degrees view angle to the 70 degrees view angle are greater than the color deviations corresponding to the 0 degree view angle.

SUMMARY OF THE INVENTION

For solving the aforesaid issues, the present invention provides a vertical alignment liquid crystal display, capable of improving the disadvantages such as the view angle color deviation and the contrast reduction of the liquid crystal display.

The present invention provides a vertical alignment liquid crystal display, comprising a plurality of data lines, a plurality of scan lines and a plurality of common electrode lines;

wherein the plurality of scan lines are disposed to intersect the plurality of data lines and the plurality of common electrode lines to form a plurality of pixel regions arranged in an array; the plurality of data lines and the plurality of common electrode lines are spaced apart from each other;

the plurality of pixel regions comprise a plurality of sub pixel regions and a plurality of main pixel regions, and the plurality of sub pixel regions and the plurality of main pixel regions are spaced apart from each other;

the sub pixel region comprises a first thin film transistor, a second thin film transistor and a sub pixel, and a gate of the first thin film transistor and a gate of the second thin film transistor are coupled to a same scan line, and a drain of the first thin film transistor and a drain of the second thin film transistor are respectively coupled to a data line and a common electrode line which are adjacent, and a source of the first thin film transistor and a source of the second thin film transistor are both coupled to the sub pixel;

the main pixel region comprises a third thin film transistor and a sub pixel, and a gate of the third thin film transistor is coupled to the scan line, and a drain of the third thin film transistor is coupled to the data line or the common electrode line, and a source of the third thin film transistor is coupled to the sub pixel.

Preferably, the first thin film transistor, the second thin film transistor and the third thin film transistor in each row of pixel regions are commonly driven by the scan lines on both sides of the row of pixel regions, and each scan line is used to drive the first thin film transistor, the second thin film transistor and the third thin film transistor of one row of pixel regions.

Preferably, the plurality of pixel regions are divided into a plurality of rows of sub pixel regions and a plurality of rows of main pixel regions, and the plurality of rows of sub pixel regions and the plurality of rows of main pixel regions are arranged spaced apart from each other.

Preferably, the sub pixels in two adjacent sub pixel regions in each row of sub pixel regions are respectively connected to the scan lines on both sides of the row of sub pixel regions with the first thin film transistor and the second thin film transistor;

the sub pixels in adjacent two main pixel regions in each row of main pixel regions are respectively connected to the scan lines on both sides of the row of main pixel regions with the third thin film transistor.

Preferably, two adjacent third thin film transistors in each row of main pixel regions are respectively connected to adjacent data line and common electrode line.

Preferably, each row of pixel regions in the plurality of pixel regions comprises a plurality of sub pixel regions and a plurality of main pixel regions that are spaced apart from each other.

Preferably, the sub pixel region and the sub pixel in the main pixel region, which are adjacent, in each row of pixel regions are respectively connected to the scan lines on both sides of the row of pixel regions.

Preferably, the sub pixel comprises a liquid crystal capacitor.

Preferably, as the liquid crystal display is in operation, two adjacent data lines are used to access data signals of opposite waveforms.

The present invention further provides a vertical alignment liquid crystal display, comprising a plurality of data lines, a plurality of scan lines and a plurality of common electrode lines;

wherein the plurality of scan lines are disposed to intersect the plurality of data lines and the plurality of common electrode lines to form a plurality of pixel regions arranged in an array; the plurality of data lines and the plurality of common electrode lines are spaced apart from each other;

the plurality of pixel regions comprise a plurality of sub pixel regions and a plurality of main pixel regions, and the plurality of sub pixel regions and the plurality of main pixel regions are spaced apart from each other;

the sub pixel region comprises a first thin film transistor, a second thin film transistor and a sub pixel, and the sub pixel comprises a liquid crystal capacitor, and a gate of the first thin film transistor and a gate of the second thin film transistor are coupled to a same scan line, and a drain of the first thin film transistor and a drain of the second thin film transistor are respectively coupled to a data line and a common electrode line which are adjacent, and a source of the first thin film transistor and a source of the second thin film transistor are both coupled to the sub pixel;

the main pixel region comprises a third thin film transistor and a sub pixel, and a gate of the third thin film transistor is coupled to the scan line, and a drain of the third thin film transistor is coupled to the data line or the common electrode line, and a source of the third thin film transistor is coupled to the sub pixel;

wherein the first thin film transistor, the second thin film transistor and the third thin film transistor in each row of pixel regions are commonly driven by the scan lines on both sides of the row of pixel regions, and each scan line is used to drive the first thin film transistor, the second thin film transistor and the third thin film transistor of one row of pixel regions.

Preferably, the plurality of pixel regions are divided into a plurality of rows of sub pixel regions and a plurality of rows of main pixel regions, and the plurality of rows of sub pixel regions and the plurality of rows of main pixel regions are arranged spaced apart from each other.

Preferably, the sub pixels in two adjacent sub pixel regions in each row of sub pixel regions are respectively connected to the scan lines on both sides of the row of sub pixel regions with the first thin film transistor and the second thin film transistor;

the sub pixels in adjacent two main pixel regions in each row of main pixel regions are respectively connected to the scan lines on both sides of the row of main pixel regions with the third thin film transistor.

Preferably, two adjacent third thin film transistors in each row of main pixel regions are respectively connected to adjacent data line and common electrode line.

Preferably, each row of pixel regions in the plurality of pixel regions comprises a plurality of sub pixel regions and a plurality of main pixel regions that are spaced apart from each other.

Preferably, the sub pixel region and the sub pixel in the main pixel region, which are adjacent, in each row of pixel regions are respectively connected to the scan lines on both sides of the row of pixel regions.

Preferably, as the liquid crystal display is in operation, two adjacent data lines are used to access data signals of opposite waveforms.

The present invention further provides a vertical alignment liquid crystal display, comprising a plurality of data lines, a plurality of scan lines and a plurality of common electrode lines;

wherein the plurality of scan lines are disposed to intersect the plurality of data lines and the plurality of common electrode lines to form a plurality of pixel regions arranged in an array; the plurality of data lines and the plurality of common electrode lines are spaced apart from each other;

the plurality of pixel regions comprise a plurality of sub pixel regions and a plurality of main pixel regions, and the plurality of sub pixel regions and the plurality of main pixel regions are spaced apart from each other;

the sub pixel region comprises a first thin film transistor, a second thin film transistor and a sub pixel, and a gate of the first thin film transistor and a gate of the second thin film transistor are coupled to a same scan line, and a drain of the first thin film transistor and a drain of the second thin film transistor are respectively coupled to a data line and a common electrode line which are adjacent, and a source of the first thin film transistor and a source of the second thin film transistor are both coupled to the sub pixel;

the main pixel region comprises a third thin film transistor and a sub pixel, and a gate of the third thin film transistor is coupled to the scan line, and a drain of the third thin film transistor is coupled to the data line or the common electrode line, and a source of the third thin film transistor is coupled to the sub pixel;

wherein the first thin film transistor, the second thin film transistor and the third thin film transistor in each row of pixel regions are commonly driven by the scan lines on both sides of the row of pixel regions, and each scan line is used to drive the first thin film transistor, the second thin film transistor and the third thin film transistor of one row of pixel regions;

wherein the plurality of pixel regions are divided into a plurality of rows of sub pixel regions and a plurality of rows of main pixel regions, and the plurality of rows of sub pixel regions and the plurality of rows of main pixel regions are arranged spaced apart from each other.

Preferably, the sub pixels in two adjacent sub pixel regions in each row of sub pixel regions are respectively connected to the scan lines on both sides of the row of sub pixel regions with the first thin film transistor and the second thin film transistor;

the sub pixels in adjacent two main pixel regions in each row of main pixel regions are respectively connected to the scan lines on both sides of the row of main pixel regions with the third thin film transistor;

wherein two adjacent third thin film transistors in each row of main pixel regions are respectively connected to adjacent data line and common electrode line.

Preferably, each row of pixel regions in the plurality of pixel regions comprises a plurality of sub pixel regions and a plurality of main pixel regions that are spaced apart from each other;

wherein the sub pixel region and the sub pixel in the main pixel region, which are adjacent, in each row of pixel regions are respectively connected to the scan lines on both sides of the row of pixel regions.

Preferably, the sub pixel comprises a liquid crystal capacitor;

wherein as the liquid crystal display is in operation, two adjacent data lines are used to access data signals of opposite waveforms.

The implementation of the present invention possesses benefits: in the present invention, two thin film transistors, i.e. the first thin film transistor and the second thin film transistor, are arranged in a sub pixel region, and the voltage on the data line is divided by the first thin film transistor and the second thin film transistor, and is applied to the sub pixel to drive the sub pixels to emit light, and the main pixel region comprises only one third thin film transistor, and the third thin film transistor is turned on to apply the entire voltage on the data line to the sub pixels. Therefore, the driving voltage of the sub pixels in the main pixel region is greater than the driving voltage of the sub pixels in the sub pixel region. Namely, the luminance of the sub pixels in the main pixel region is greater than the luminance of the sub pixels in the sub pixel region. The main pixel area and the sub pixel area are spaced apart from each other, and the brightness of the main pixel area and the brightness of the sub pixel area are mutually neutralized, which can reduce the view angle color deviation of the vertical alignment type liquid crystal display, particularly some large view angle color deviation, such as a 70-degrees viewing angle, and can improve the disadvantage of the contrast reduction of the liquid crystal display.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Figure 1:
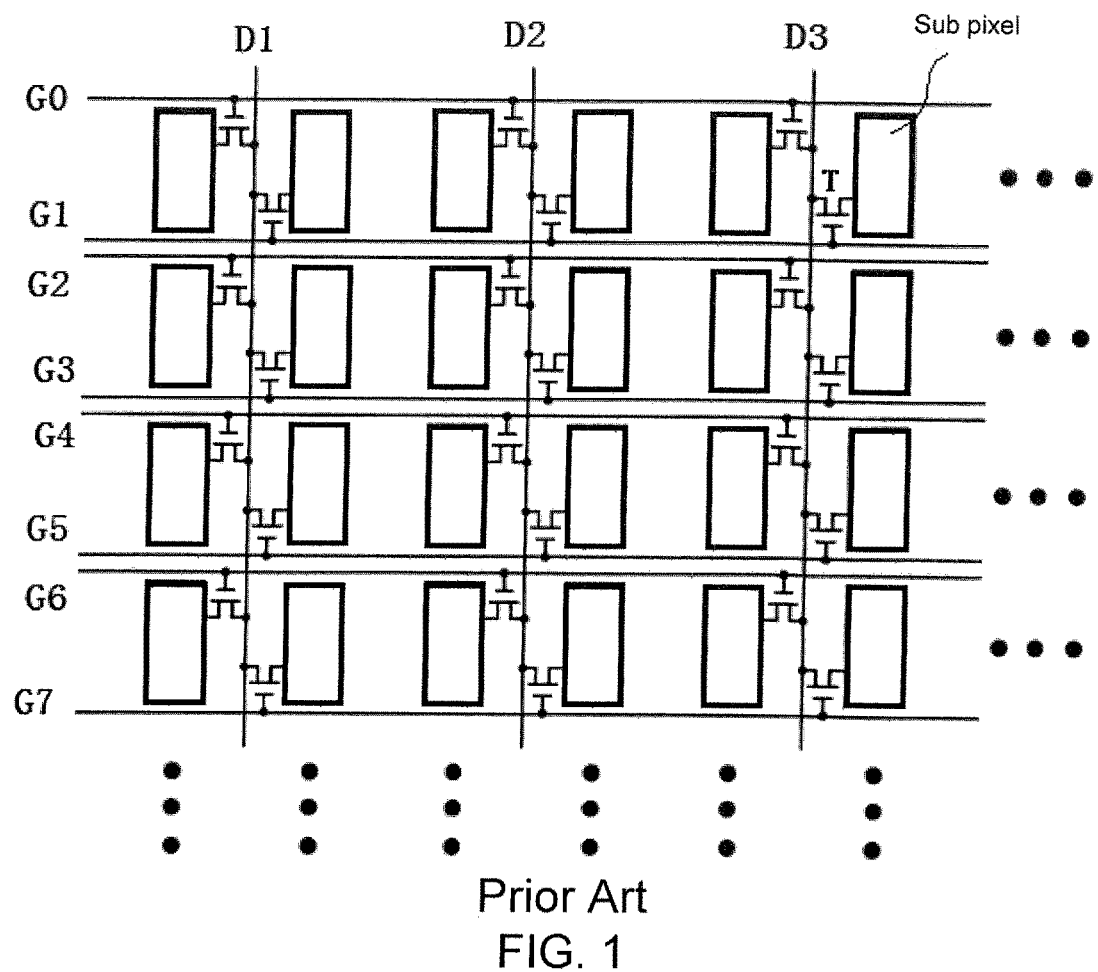
FIG. 1 is a diagram of a common driving circuit of a liquid crystal display according to the prior art.
Figure 2:
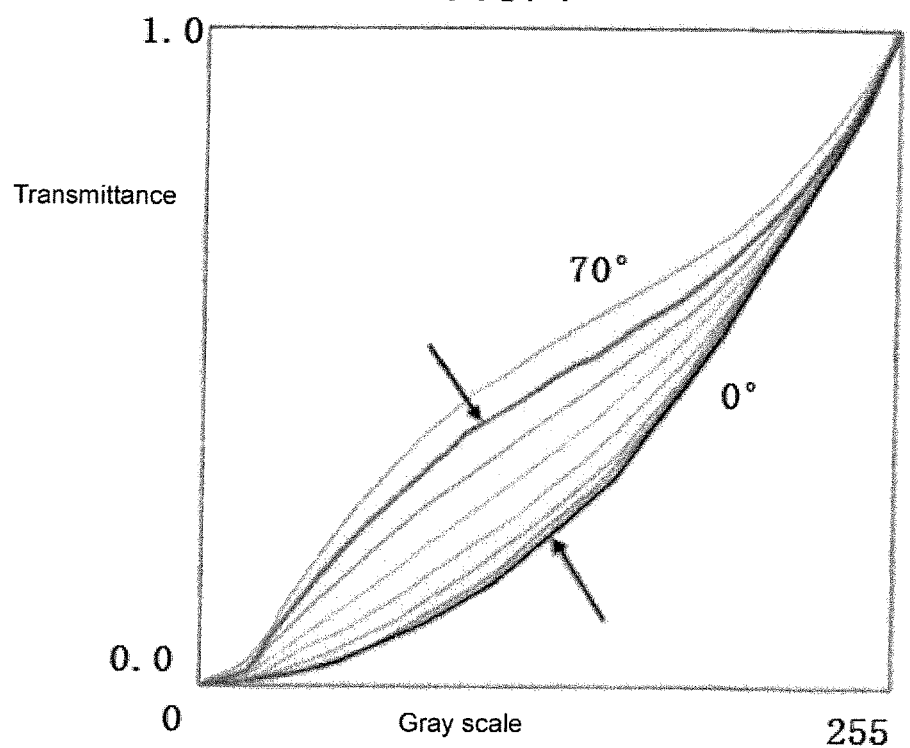
FIG. 2 is a gamma curve diagram of a vertical alignment liquid crystal display provided by the present invention at different viewing angles.

The present invention provides a vertical alignment liquid crystal display. The vertical alignment liquid crystal display comprises a plurality of data lines, a plurality of scan lines and a plurality of common electrode lines.

The plurality of scan lines are disposed to intersect the plurality of data lines and the plurality of common electrode lines to form a plurality of pixel regions arranged in an array; the plurality of data lines and the plurality of common electrode lines are spaced apart from each other and evenly distributed.

The plurality of pixel regions comprise a plurality of sub pixel regions and a plurality of main pixel regions, and the plurality of sub pixel regions and the plurality of main pixel regions are spaced apart from each other.

The sub pixel region comprises a first thin film transistor, a second thin film transistor and a sub pixel, and a gate of the first thin film transistor and a gate of the second thin film transistor are coupled to a same scan line, and a drain of the first thin film transistor and a drain of the second thin film transistor are respectively coupled to a data line and a common electrode line which are adjacent, and a source of the first thin film transistor and a source of the second thin film transistor are both coupled to the sub pixel.

The main pixel region comprises a third thin film transistor and a sub pixel, and a gate of the third thin film transistor is coupled to the scan line, and a drain of the third thin film transistor is coupled to the data line or the common electrode line, and a source of the third thin film transistor is coupled to the sub pixel.

The gate of the first thin film transistor and the gate of the second thin film transistor are coupled to the same scan line, and the first thin film transistor and the second thin film transistor can be controlled to be turned on or off at the same time.

Furthermore, the first thin film transistor, the second thin film transistor and the third thin film transistor in each row of pixel regions are commonly driven by the scan lines on both sides of the row of pixel regions, and each scan line is used to drive the first thin film transistor, the second thin film transistor and the third thin film transistor of one row of pixel regions.

The plurality of pixel regions are divided into a plurality of rows of sub pixel regions and a plurality of rows of main pixel regions, and the plurality of rows of sub pixel regions and the plurality of rows of main pixel regions are arranged spaced apart from each other. For instance, a pixel region of the nth row is the main pixel region, and then a pixel region of the n+1th row is a sub pixel region, and n>0.

Furthermore, the sub pixels in two adjacent sub pixel regions in each row of sub pixel regions are respectively connected to the scan lines on both sides of the row of sub pixel regions with the first thin film transistor and the second thin film transistor.

The sub pixels in adjacent two main pixel regions in each row of main pixel regions are respectively connected to the scan lines on both sides of the row of main pixel regions with the third thin film transistor.

Furthermore, two adjacent third thin film transistors in each row of main pixel regions are respectively connected to adjacent data line and common electrode line. Namely, one of the two adjacent third thin film transistors is connected to the data line, and the other is connected to the common electrode line. The common electrode line is connected to a common voltage, and the common voltage may be zero volt or not zero volt.

Furthermore, each row of pixel regions in the plurality of pixel regions comprises a plurality of sub pixel regions and a plurality of main pixel regions that are spaced apart from each other.

Furthermore, the sub pixel region and the sub pixel in the main pixel region, which are adjacent, in each row of pixel regions are respectively connected to the scan lines on both sides of the row of pixel regions. Specifically, the sub pixel in the main pixel region is connected to one of the scan lines through the third thin film transistor, and the sub pixel in the sub pixel region is connected to the other scan line through the first thin film transistor and the second thin film transistor.

Furthermore, the sub pixel comprises a liquid crystal capacitor, and the liquid crystal capacitor comprises a pixel electrode and a common electrode disposed opposite to each other, and a liquid crystal sandwiched between the pixel electrode and the common electrode. The source of the first thin film transistor and the source of the second thin film transistor are connected to the pixel electrode of the liquid crystal capacitor, and the source of the third thin film transistor is connected to the pixel electrode of the liquid crystal capacitor, and the common electrode of the liquid crystal capacitor is connected to the common electrode line.

Furthermore, as the liquid crystal display is in operation, two adjacent data lines are used to access data signals of opposite waveforms. For instance, at a specific moment, the nth data line is connected to a high potential signal, and the n+1th data line is connected to a low potential signal.

Figure 3:
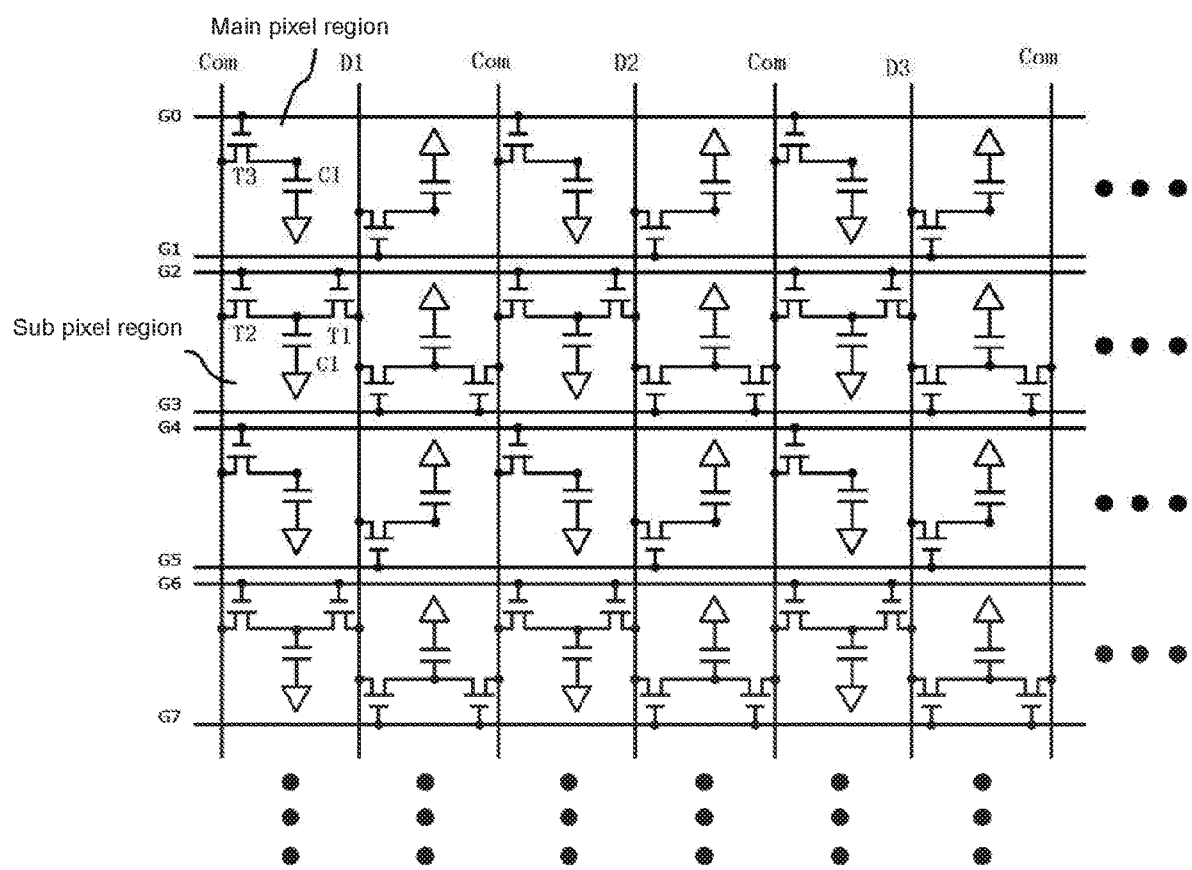
FIG. 3 is a diagram of a driving circuit of a vertical alignment liquid crystal display in the first embodiment provided by the present invention.

As shown in FIG. 3, in the first embodiment, the plurality of data lines D1, D2, D3, the plurality of common electrode lines Com, and the plurality of scan lines G0, G1, . . . G7 are intersected to form the plurality of pixel regions, and the plurality of data lines D1, D2, D3 and the plurality of common electrode lines Com are spaced apart from each other. The pixel circuits corresponding to the pixel regions of the odd and even rows are different. The pixel region of the odd row comprises only one third thin film transistor T3 and one liquid crystal capacitor CI, so each pixel region of the odd row is the main pixel region; the pixel region of the even row comprises a first thin film transistor T1, a second thin film transistor T2 and a liquid crystal capacitor CI, so each pixel region of the even row is a sub pixel region.

Figure 4:
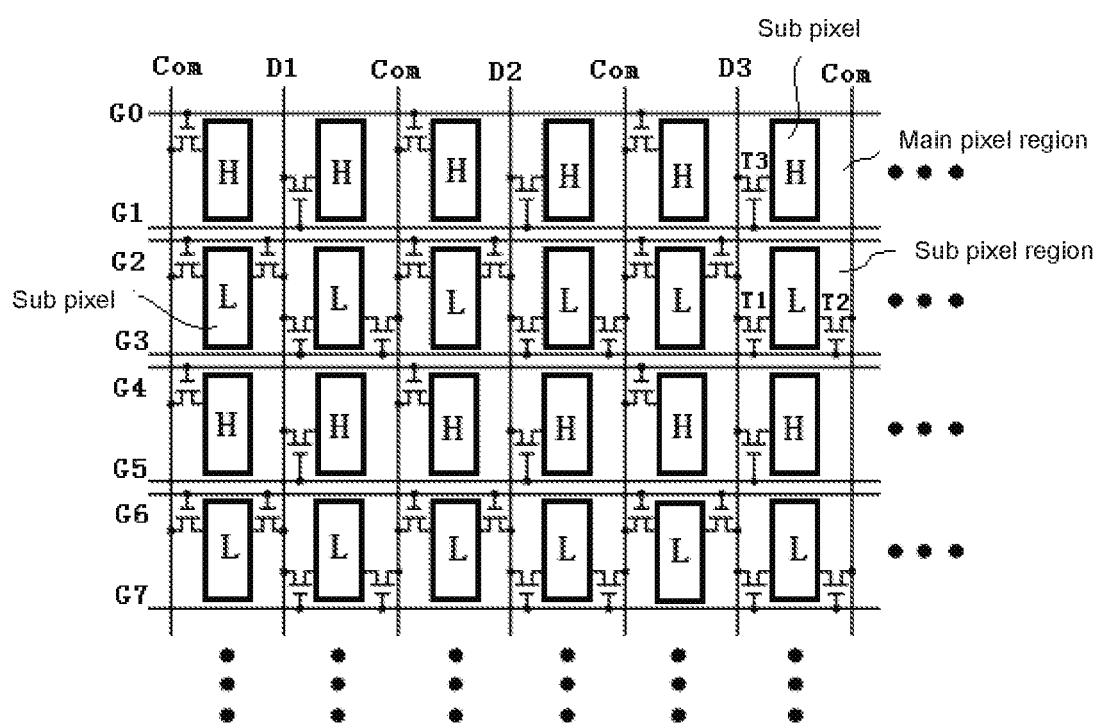
FIG. 4 is a pixel arrangement diagram of a vertical alignment liquid crystal display in the first embodiment provided by the present invention.

As shown in FIG. 4, each liquid crystal capacitor CI constructs one sub pixel. H represents a sub pixel of the main pixel region, L represents a sub pixel of the sub pixel region, the sub pixels of the first row are sub pixels of the main pixel region, and the sub pixels of the second row are sub pixels of the sub pixel region, which are sequentially and alternately distributed.

Figure 5:
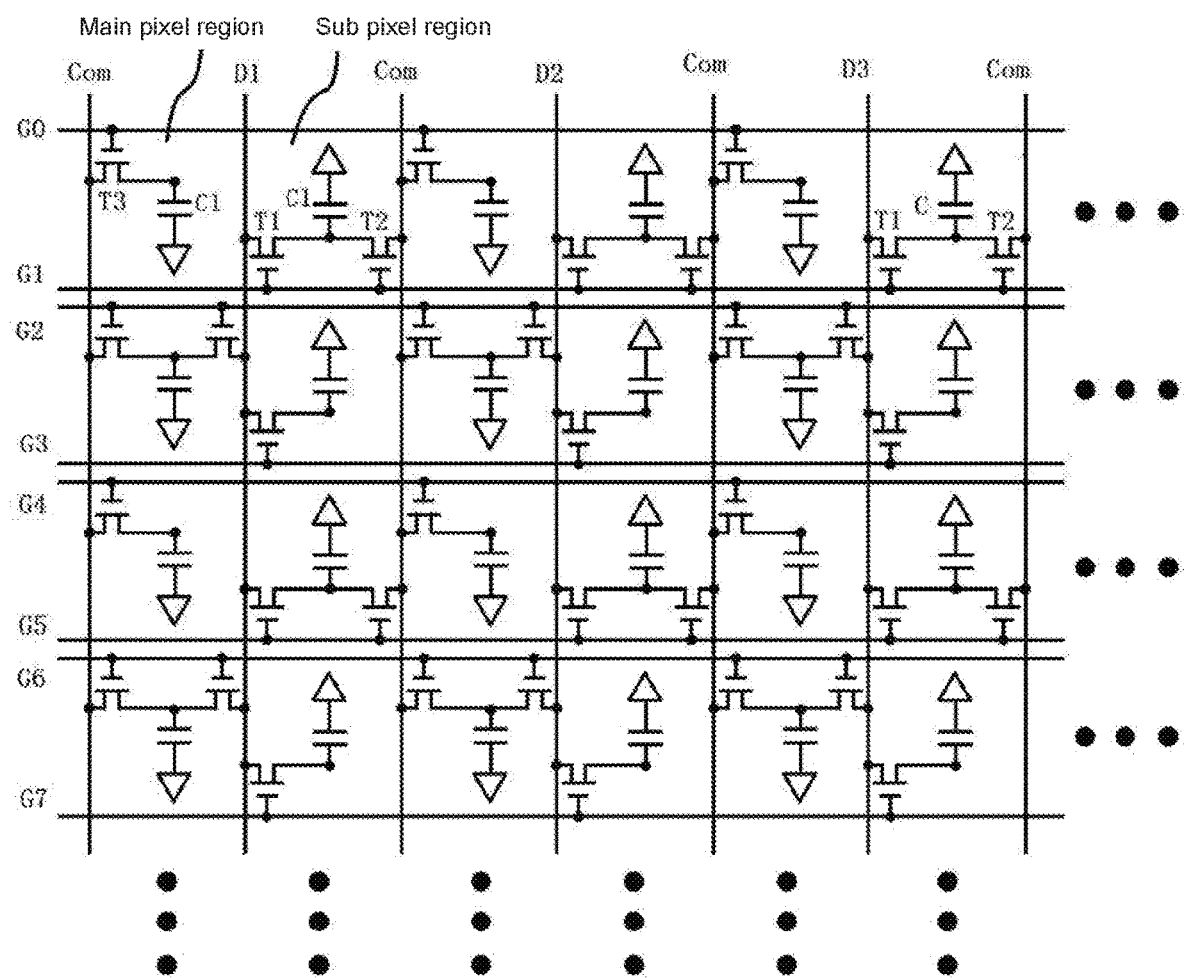
FIG. 5 is a diagram of a driving circuit of a vertical alignment liquid crystal display in the second embodiment provided by the present invention.

As shown in FIG. 5, in the second embodiment, each row of pixel regions comprises a main pixel region and a sub pixel region that are spaced apart from each other.

Figure 6:
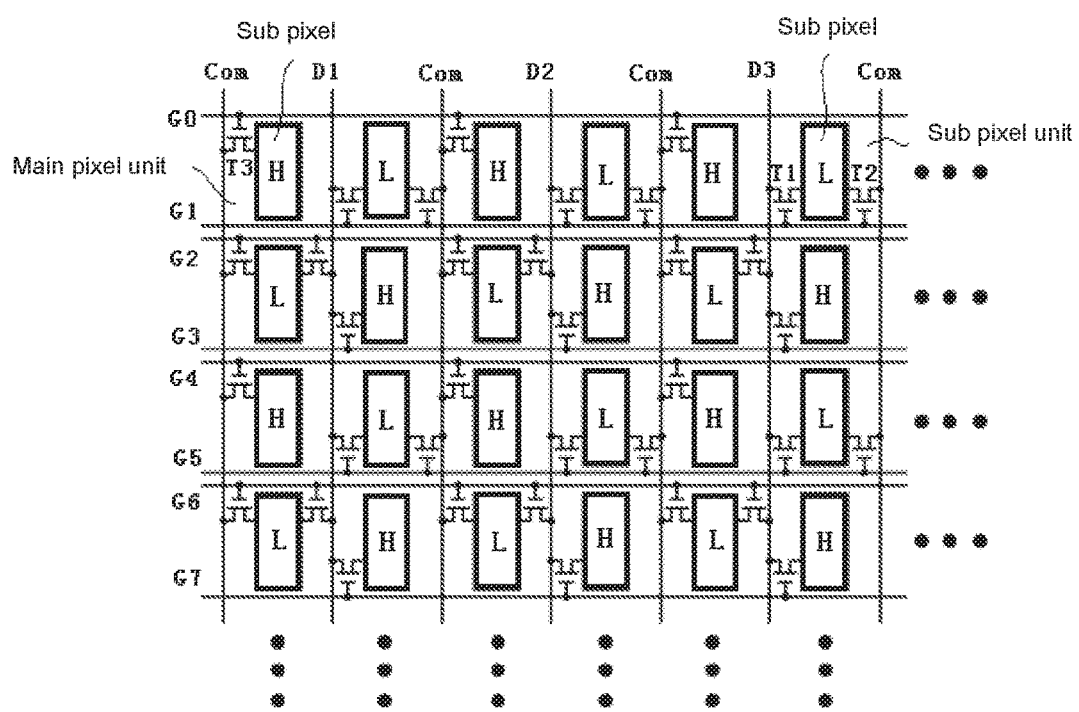
FIG. 6 is a pixel arrangement diagram of a vertical alignment liquid crystal display in the second embodiment provided by the present invention.

As shown in FIG. 6, each row of sub pixels comprises sub pixels of main pixel regions and sub pixels of sub pixel region that are spaced apart from each other.

In the aforesaid first embodiment and second embodiment, the sub pixel region comprises two thin film transistors, i.e. the first thin film transistor T1 and the second thin film transistor T2. These two thin film transistors are connected in series to divide the voltage on the data line so that the voltage driving the liquid crystal capacitor CI is smaller than the voltage on the data line. The main pixel region comprises only one thin film transistor. The voltage on the data line can be completely applied to the liquid crystal capacitor CI, and the voltage driving liquid crystal capacitor is the same as the voltage on the data line. Therefore, the driving voltage of the liquid crystal capacitor CI in the main pixel region is larger than the driving voltage of the liquid crystal capacitor CI in the sub pixel region.

The liquid crystal capacitor CI comprises a pixel electrode, a common electrode, and a liquid crystal sandwiched between the pixel electrode and the common electrode. The driving voltage of the liquid crystal capacitor CI is different, resulting in different liquid crystal deflections in the main pixel region and the sub pixel region, and the main pixel area and the sub pixel area are spaced apart from each other. The liquid crystal is more evenly dispersed for the entire liquid crystal display. No liquid crystal display angle is the same as that of the liquid crystal display. The low brightness area on the liquid crystal display will be neutralized with the surrounding high brightness area. Therefore, the disadvantages of contrast reduction and color shift of the liquid crystal display in a large viewing angle can be improved.

Figure 7:
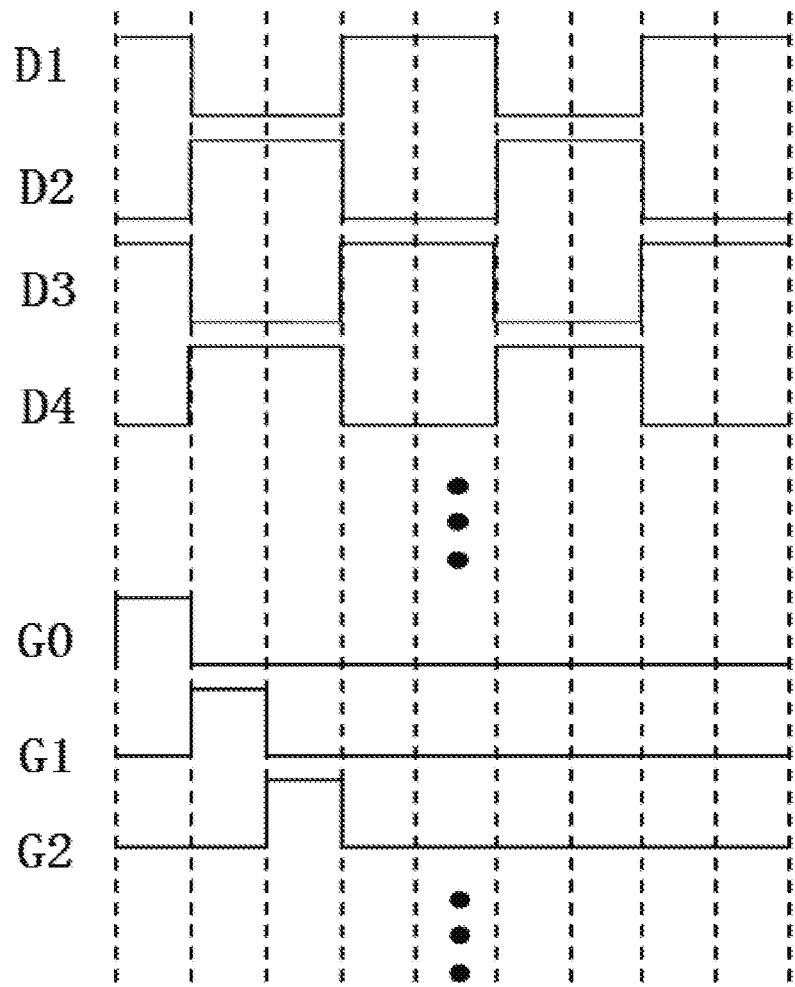
FIG. 7 is a driving sequence diagram of a vertical alignment liquid crystal display provided by the present invention.

As shown in FIG. 7, the waveforms of the data signals on the data lines D1 and D3 are the same, the waveforms of the data signals on the data lines D2 and D4 are the same, and the waveforms of the data lines D1 and D2 are opposite. This can prevent the display failure of the liquid crystal display. For instance, the display failure of the liquid crystal display can be avoided by avoiding the occurrence of signal crosstalk between adjacent data lines.

In conclusion, in the present invention, two thin film transistors, i.e. the first thin film transistor and the second thin film transistor, are arranged in a sub pixel region, and the voltage on the data line is divided by the first thin film transistor and the second thin film transistor, and is applied to the sub pixel to drive the sub pixels to emit light, and the main pixel region comprises only one third thin film transistor, and the third thin film transistor is turned on to apply the entire voltage on the data line to the sub pixels. Therefore, the driving voltage of the sub pixels in the main pixel region is greater than the driving voltage of the sub pixels in the sub pixel region. Namely, the luminance of the sub pixels in the main pixel region is greater than the luminance of the sub pixels in the sub pixel region. The main pixel area and the sub pixel area are spaced apart from each other, and the brightness of the main pixel area and the brightness of the sub pixel area are mutually neutralized, which can reduce the view angle color deviation of the vertical alignment type liquid crystal display, particularly some large view angle color deviation, such as a 70-degrees viewing angle, and can improve the disadvantage of the contrast reduction of the liquid crystal display.

The above content with the specific preferred embodiments of the present invention is further made to the detailed description, the specific embodiments of the present invention should not be considered limited to these descriptions. Those of ordinary skill in the art for the present invention, without departing from the spirit of the present invention, can make various simple deduction or replacement, should be deemed to belong to the scope of the present invention.

What is claimed is:

1. A vertical alignment liquid crystal display, comprising a plurality of data lines, a plurality of scan lines and a plurality of common electrode lines;
   wherein the plurality of scan lines are disposed to intersect the plurality of data lines and the plurality of common electrode lines to form a plurality of pixel regions arranged in an array; the plurality of data lines and the plurality of common electrode lines are spaced apart from each other;
   each of the plurality of pixel regions comprise a sub pixel region and a main pixel region, and the plurality of sub pixel regions and the plurality of main pixel regions of the plurality of pixel regions arranged in an array are spaced apart from each other;
   the sub pixel region comprises a first thin film transistor, a second thin film transistor and a sub pixel, and a gate of the first thin film transistor and a gate of the second thin film transistor are coupled to a same scan line of the plurality of scan lines, and a drain of the first thin film transistor and a drain of the second thin film transistor are respectively coupled to a data line and a common electrode line which are adjacent, and a source of the first thin film transistor and a source of the second thin film transistor are both coupled to the sub pixel of the sub pixel region;
   the main pixel region comprises a third thin film transistor and a sub pixel, and a gate of the third thin film transistor is coupled to a scan line of the plurality of scan lines, and a drain of the third thin film transistor is coupled to the data line or the common electrode line, and a source of the third thin film transistor is coupled to the sub pixel of the main pixel region;
   wherein as the liquid crystal display is in operation, two adjacent data lines are used to access data signals of opposite waveforms to prevent occurrence of signal crosstalk between the two adjacent data lines;
   wherein the plurality of pixel regions are divided into a plurality of rows of sub pixel regions and a plurality of rows of main pixel regions, and the plurality of rows of sub pixel regions and the plurality of rows of main pixel regions are arranged spaced apart from each other;
   wherein the sub pixels in two adjacent sub pixel regions in each row of sub pixel regions are respectively connected to the scan lines on both sides of the row of sub pixel regions with the first thin film transistor and the second thin film transistor;
   the sub pixels in adjacent two main pixel regions in each row of main pixel regions are respectively connected to the scan lines on both sides of the row of main pixel regions with the third thin film transistor.

2. The vertical alignment liquid crystal display according to claim 1, wherein each row of pixel regions in the plurality of pixel regions comprises a plurality of sub pixel regions and a plurality of main pixel regions that are spaced apart from each other.

3. The vertical alignment liquid crystal display according to claim 2, wherein the sub pixel region and the sub pixel in the main pixel region, which are adjacent, in each row of pixel regions are respectively connected to the scan lines on both sides of the row of pixel regions.

4. The vertical alignment liquid crystal display according to claim 1, wherein the first thin film transistor, the second thin film transistor and the third thin film transistor in each row of pixel regions are commonly driven by the scan lines on both sides of the row of pixel regions, and each scan line is used to drive the first thin film transistor, the second thin film transistor and the third thin film transistor of one row of pixel regions.

5. The vertical alignment liquid crystal display according to claim 1, wherein two adjacent third thin film transistors in each row of main pixel regions are respectively connected to adjacent data line and common electrode line.

6. The vertical alignment liquid crystal display according to claim 1, wherein the sub pixel comprises a liquid crystal capacitor.

7. A vertical alignment liquid crystal display, comprising a plurality of data lines, a plurality of scan lines and a plurality of common electrode lines;
   wherein the plurality of scan lines are disposed to intersect the plurality of data lines and the plurality of common electrode lines to form a plurality of pixel regions arranged in an array; the plurality of data lines and the plurality of common electrode lines are spaced apart from each other;
   each of the plurality of pixel regions comprise a sub pixel region and a main pixel region, and the plurality of sub pixel regions and the plurality of main pixel regions of the plurality of pixel regions arranged in an array are spaced apart from each other;
   the sub pixel region comprises a first thin film transistor, a second thin film transistor and a sub pixel, and the sub pixel comprises a liquid crystal capacitor, and a gate of the first thin film transistor and a gate of the second thin film transistor are coupled to a same scan line of the plurality of scan lines, and a drain of the first thin film transistor and a drain of the second thin film transistor are respectively coupled to a data line and a common electrode line which are adjacent, and a source of the first thin film transistor and a source of the second thin film transistor are both coupled to the sub pixel of the sub pixel region;
   the main pixel region comprises a third thin film transistor and a sub pixel, and a gate of the third thin film transistor is coupled to a scan line of the plurality of scan lines, and a drain of the third thin film transistor is coupled to the data line or the common electrode line, and a source of the third thin film transistor is coupled to the sub pixel of the main pixel region;
   wherein the first thin film transistor, the second thin film transistor and the third thin film transistor in each row of pixel regions are commonly driven by two scan lines on both sides of the row of pixel regions, and each of the scan lines on both sides of the row of pixel regions is used to drive the first thin film transistor, the second thin film transistor and the third thin film transistor of one row of pixel regions;
   wherein as the liquid crystal display is in operation, two adjacent data lines are used to access data signals of opposite waveforms to prevent occurrence of signal crosstalk between the two adjacent data lines;
   wherein the plurality of pixel regions are divided into a plurality of rows of sub pixel regions and a plurality of rows of main pixel regions, and the plurality of rows of sub pixel regions and the plurality of rows of main pixel regions are arranged spaced apart from each other;
   wherein the sub pixels in two adjacent sub pixel regions in each row of sub pixel regions are respectively connected to the scan lines on both sides of the row of sub pixel regions with the first thin film transistor and the second thin film transistor;

the sub pixels in adjacent two main pixel regions in each row of main pixel regions are respectively connected to the scan lines on both sides of the row of main pixel regions with the third thin film transistor.

8. The vertical alignment liquid crystal display according to claim 7, wherein each row of pixel regions in the plurality of pixel regions comprises a plurality of sub pixel regions and a plurality of main pixel regions that are spaced apart from each other.

9. The vertical alignment liquid crystal display according to claim 8, wherein the sub pixel region and the sub pixel in the main pixel region, which are adjacent, in each row of pixel regions are respectively connected to the scan lines on both sides of the row of pixel regions.

10. The vertical alignment liquid crystal display according to claim 7, wherein two adjacent third thin film transistors in each row of main pixel regions are respectively connected to adjacent data line and common electrode line.

11. A vertical alignment liquid crystal display, comprising a plurality of data lines, a plurality of scan lines and a plurality of common electrode lines;
wherein the plurality of scan lines are disposed to intersect the plurality of data lines and the plurality of common electrode lines to form a plurality of pixel regions arranged in an array; the plurality of data lines and the plurality of common electrode lines are spaced apart from each other;
each of the plurality of pixel regions comprise a sub pixel region and a main pixel region, and the plurality of sub pixel regions and the plurality of main pixel regions of the plurality of pixel regions arranged in an array are spaced apart from each other;
the sub pixel region comprises a first thin film transistor, a second thin film transistor and a sub pixel, and a gate of the first thin film transistor and a gate of the second thin film transistor are coupled to a same scan line of the plurality of scan lines, and a drain of the first thin film transistor and a drain of the second thin film transistor are respectively coupled to a data line and a common electrode line which are adjacent, and a source of the first thin film transistor and a source of the second thin film transistor are both coupled to the sub pixel of the sub pixel region;
the main pixel region comprises a third thin film transistor and a sub pixel, and a gate of the third thin film transistor is coupled to a scan line of the plurality of scan lines, and a drain of the third thin film transistor is coupled to the data line or the common electrode line, and a source of the third thin film transistor is coupled to the sub pixel of the main pixel region;
wherein the first thin film transistor, the second thin film transistor and the third thin film transistor in each row of pixel regions are commonly driven by two scan lines on both sides of the row of pixel regions, and each of the scan lines on both sides of the row of pixel regions is used to drive the first thin film transistor, the second thin film transistor and the third thin film transistor of one row of pixel regions;
wherein the plurality of pixel regions are divided into a plurality of rows of sub pixel regions and a plurality of rows of main pixel regions, and the plurality of rows of sub pixel regions and the plurality of rows of main pixel regions are arranged spaced apart from each other;
wherein the sub pixel comprises a liquid crystal capacitor;
wherein as the liquid crystal display is in operation, two adjacent data lines are used to access data signals of opposite waveforms to prevent occurrence of signal crosstalk between the two adjacent data lines;
wherein the sub pixels in two adjacent sub pixel regions in each row of sub pixel regions are respectively connected to the scan lines on both sides of the row of sub pixel regions with the first thin film transistor and the second thin film transistor;
the sub pixels in adjacent two main pixel regions in each row of main pixel regions are respectively connected to the scan lines on both sides of the row of main pixel regions with the third thin film transistor;
wherein two adjacent third thin film transistors in each row of main pixel regions are respectively connected to adjacent data line and common electrode line.

12. The vertical alignment liquid crystal display according to claim 11, wherein each row of pixel regions in the plurality of pixel regions comprises a plurality of sub pixel regions and a plurality of main pixel regions that are spaced apart from each other;
wherein the sub pixel region and the sub pixel in the main pixel region, which are adjacent, in each row of pixel regions are respectively connected to the scan lines on both sides of the row of pixel regions.

* * * * *